Feb. 15, 1966 H. G. BLANK 3,235,735

OSCILLATOR EMPLOYING ELECTROLUMINESCENT AND PHOTOCONDUCTIVE COMPONENTS

Filed Sept. 4, 1962

HANS G. BLANK
INVENTOR

BY R. J. Frank
ATTORNEY

United States Patent Office 3,235,735
Patented Feb. 15, 1966

3,235,735
OSCILLATOR EMPLOYING ELECTROLUMINESCENT AND PHOTOCONDUCTIVE COMPONENTS

Hans G. Blank, New York, N.Y., assignor to General Telephone and Electronics Laboratories, Inc., a corporation of Delaware Filed Sept. 4, 1962, Ser. No. 221,101
1 Claim. (Cl. 250—209)

This invention relates to oscillators and in particular to an oscillator utilizing electroluminescent and photoconductive components.

It is an object of my invention to provide an oscillator utilizing light emitting and light responsive impedance components.

Another object of the invention is to provide an oscillator capable of selectively producing a pulsed light output, a modulated A.-C. voltage output, and a pulsed D.-C. output voltage.

Still another object is to provide an oscillator utilizing electroluminescent and photoconductive components in which the pulse repetition frequency is adjustable.

In the present invention an oscillator is provided which comprises an input unit, a delay unit coupled to the input unit, and a feedback unit coupled between the delay unit and the input unit. In addition, output units may be coupled to the input and delay units.

When an input light pulse is received by the input unit it produces a first light output pulse. The first light output pulse is optically coupled into the delay unit and, after a predetermined interval, a second light output pulse is produced at the output of the delay unit. The second light output pulse is optically coupled into the feedback unit which produces a third light output pulse. This third light output pulse is coupled into the input unit and comprises the input light pulse.

The input unit includes a light responsive impedance element electrically connected in series with a light emitting element. The delay unit consists of N delay stages where N is any integer, each delay stage including a light responsive impedance element electrically connected in series with a light emitting element. The light responsive impedance element in the first delay stage is optically coupled to the light emitting element in the input unit and the light responsive impedance element in each of the remaining delay stages is optically coupled to the light emitting element in the preceding delay stage.

The feedback unit includes a light responsive feedback impedance element electrically connected in series with a light insensitive impedance element and is optically coupled to the light emitting element in the Nth stage of the delay unit. The feedback unit also includes a light emitting element electrically connected in parallel with the light responsive feedback impedance element and optically coupled to the light responsive impedance element in the input unit. The input, delay and feedback units are electrically connected in parallel across a voltage source.

In one embodiment of the invention, each of the light responsive impedance elements consists of a photoconductor having a high impedance in the absence of light and a relatively low impedance when illuminated. In a typical photoconductor, the ratio of dark to light may be as much as 1000 to 1. The light emitting elements are preferably electroluminescent cells which produce light whenever a voltage of suitable magnitude and frequency is applied across their terminals. The light insensitive impedance element is preferably a variable capacitor having a maximum impedance at the excitation frequency which is much less than that of the electroluminescent cell in the feedback unit.

When voltage is applied across the oscillator the electroluminescent cell in the feedback unit is energized and emits light. This cell is energized because the impedance of the capacitor in series with it is much smaller than the impedance of the electroluminescent cell and therefore most of the applied voltage is impressed across the cell. Light from the electroluminescent cell in the feedback unit falls upon the photoconductive element in the input stage thereby reducing its impedance from a relatively high value to a relatively low value and causing the electroluminescent cell in the input unit to be energized and emit light. Light from the electroluminescent cell in the input unit then falls on the photoconductor in the first delay stage which energizes the electroluminescent cell in that stage. Light from the electroluminescent cell in the first stage illuminates the photoconductor in the second delay stage causing the electroluminescent cell in the second delay stage to emit light and illuminate the photoconductor in the third delay stage. This continues until the electroluminescent cell in the Nth stage is energized. The light from this cell then illuminates the photoconductor in the feedback unit shunting the feedback electroluminescent cell and de-energizing it.

Since the electroluminescent cell in the feedback unit is no longer energized, the photoconductor in the input unit becomes dark, its impedance increases, and the electroluminescent cell in the input unit is deenergized. As a result, each of the electroluminescent cells in the delay unit is deenergized sequentially. When the electroluminescent cell in the Nth stage is deenergized, the photoconductor in the feedback unit is no longer illuminated and the feedback electroluminescent cell is again energized. As a result the cycle is repeated and continues until the voltage source is removed.

The delay provided by the delay unit should be sufficient to permit the electroluminescent cell in the feedback unit to be turned completely on and then completely off during each cycle.

The output of the oscillator may be obtained as a light signal from any of the electroluminescent cells. Alternatively, a photoconductor optically coupled to one of the electroluminescent cells may be electrically connected in series with an A.C. or D.C. voltage to produce "bursts" of A.C. voltage or a pulsed D.C. output.

The above objects of and the brief introduction to the present invention will be more fully understood and further objects and advantages will become apparent from a study of the following description in connection with the drawings, wherein.

Figures 1, 2:
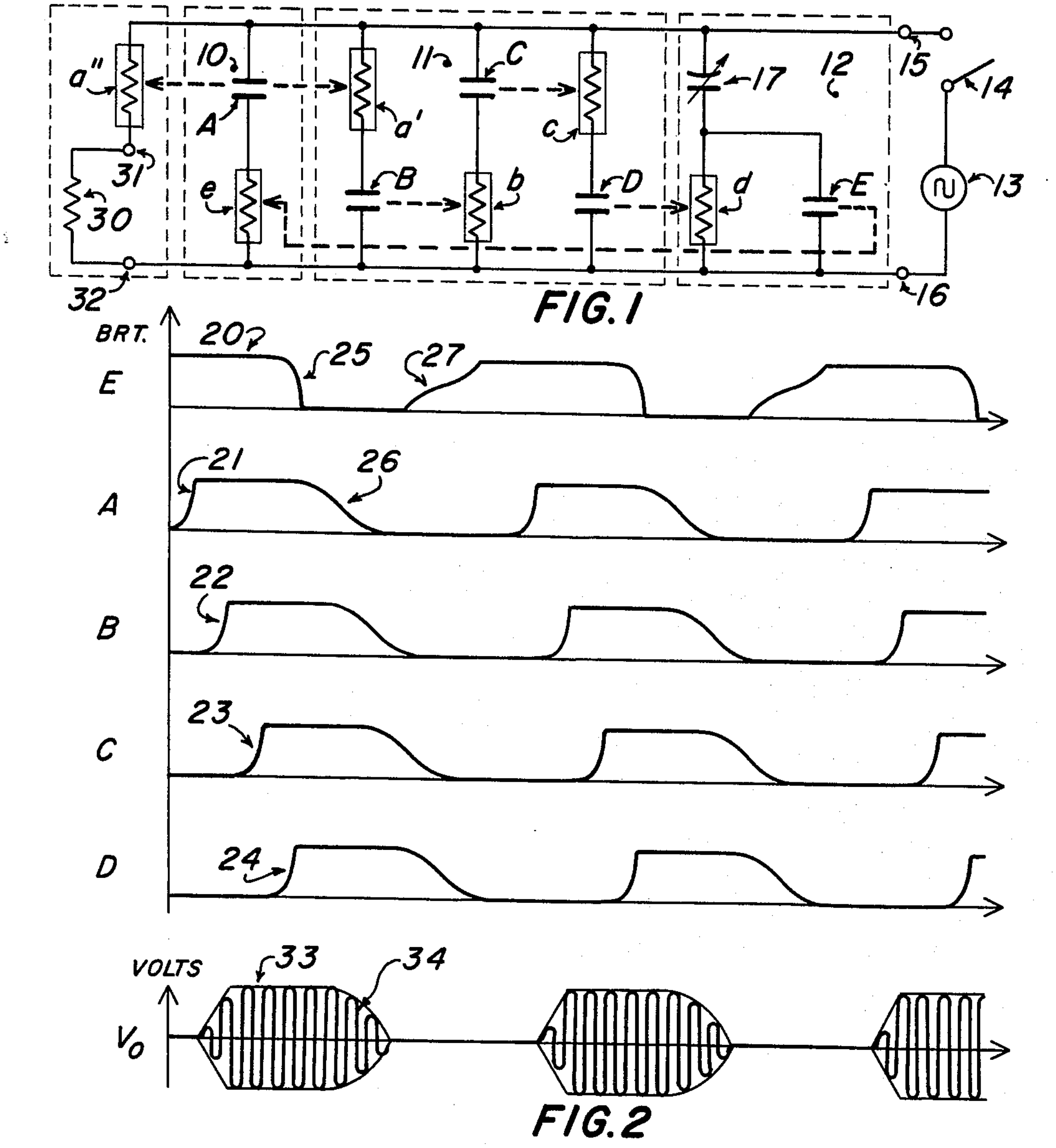
FIG. 1 is a schematic diagram of one embodiment of my invention.
FIG. 2 is a diagram showing idealized light and voltage outputs obtained from the circuit of FIG. 1.

Referring to FIG. 1, there is shown an oscillator comprising an input unit 10, a delay unit 11, and a feedback unit 12. Each of these units includes at least one electroluminescent cell and at least one photoconductor. The electroluminescent cells are identified by capital letters and the photoconductors by lower case letters, the lower case letter identifying each photoconductor corresponding to the capital letter identifying the electroluminescent cell to which it is optically coupled. Optical coupling between an electroluminescent cell and a photoconductor is indicated by a dashed arrow. A source of alternating voltage 13 is connected through a switch 14 and a pair of terminals 15 and 16 to units 10–12.

Input unit 10 consists of an electroluminescent cell A connected in series with a photoconductor *e*. The delay unit 11 consists of three stages, the first stage including a photoconductor *a'* connected in series with an electroluminescent cell B, the second stage including a photoconductor $b$ connected in series with an electroluminescent cell C, and the third stage including a photoconductor $c$ connected in series with an electroluminescent cell D. Photoconductor $a'$ is optically coupled to electroluminescent cell A in input unit 10, photoconductor $b$ is optically coupled to electroluminescent cell B, and photoconductor $c$ is optically coupled to electroluminescent cell C. Although three delay stages are shown, it shall be understood that the oscillator may have any number of stages depending upon the desired length of the period of oscillation. A longer period may be obtained by increasing the number of delay stages and a shorter period (i.e. higher frequency) by decreasing the number of stages.

The feedback unit 12 includes a variable capacitor 17 connected in series with a photoconductor $d$ and an electroluminescent cell E connected in parallel with photoconductor $d$. Photoconductor $d$ is optically coupled to electroluminescent cell D in the delay unit and electroluminescent cell E is optically coupled to photoconductor $e$ in the input unit.

When switch 14 is open, the electroluminescent cells are off and the photoconductor impendances are high. Closing switch 14 connects voltage source 13 across capacitor 17 and the parallel combination of electroluminescent cell E and photoconductor $d$. The impedance of capacitor 17 at the frequency of voltage source 13 is about one-tenth that of cell E and therefore most of the voltage is applied across the cell and it emits light. (Since photoconductor $d$ is dark, its impedance is much higher than that of electroluminescent cell E and it has negligible effect on the voltage across the cell.) The brightness of cell E as a function of time is plotted at 20 in FIG. 2 and, as indicated, rises almost instantaneously when voltage is initially applied across the cell.

Light from electroluminescent cell E falls upon photoconductor $e$ in input circuit 10 causing the impedance of this photoconductor to decrease. A finite time is required for the impedance of photoconductor $e$ to decrease, the brightness of electroluminescent cell A increasing relatively slowly at first and then rapidly as shown at 21 in FIG. 2. When electroluminescent cell A has reached substantially full brightness, the impedance of illuminated photoconductor $a'$ begins to decrease causing electroluminescent cell B to begin to emit light as shown at 22. Light from cell B illuminates photoconductor $b$ energizing electroluminescent cell C and light from electroluminescent cell C impinges on photoconductor $c$ energizing electroluminescent cell D as shown in the brightness-time curves at 23 and 24 respectively. Since the impedance of each of the photoconductors in delay unit 11 requires a finite time to decrease, a delay is produced in unit 11 which is proportional to the number of photoconductors in the unit.

Light from electroluminescent cell D falls upon photoconductor $d$ in feedback unit 12. This causes the impedance of photoconductor $d$ to decrease, effectively short circuiting electroluminescent cell E and extinguishing it as shown at 25. Photoconductor $e$ is now dark and therefore its impedance increases causing the light emission of electroluminescent cell A to decrease as shown at 26. Photoconductors $a$–$e$ have a ratio of decay to rise time of approximately 3/1, as indicated by curve portions 21 and 26 respectively.

Deenergizing electroluminescent cell A darkens photoconductor $a'$ causing its impedance to rise and deenergize cell B. When cell B is deenergized, photoconductor $b$ is darkened and electroluminescent cell C is deenergized. In turn, the impedance of darkened photoconductor $c$ increases deenergizing electroluminescent cell D which darkens photoconductor $d$. The darkening of photoconductor $d$ increases its impedance and therefore the impedance across electroluminescent cell D is increased. As a resurt, the voltage across cell E increases causing an increase in brightness as indicated at 27. Thus, the cycle is repeated and continues until power is removed from the oscillator.

The response times of the oscillator components should be selected so that electroluminescent cell E is turned completely on before photoconductor $d$ is illuminated by electroluminescent cell D. Also, during the second half of the cycle, electroluminescent cell E should be completely off before the illumination is removed from photoconductor $d$.

A light output may be obtained from any of cells A to E and may be used to control any light responsive output device. Alternatively, a photoconductor $a''$ may be connected in series with a load 30 coupled to output terminals 31 and 32. The voltage $V_o$ appearing across terminals 31 and 32 is shown in FIG. 2 and consists of an envelope 33 which amplitude modulates the A.C. carrier 34, carrier 34 having a frequency equal to that of voltage source 13. With a given number of delay stages, small frequency changes may be made by adjusting variable capacitor 17.

Figure 3:
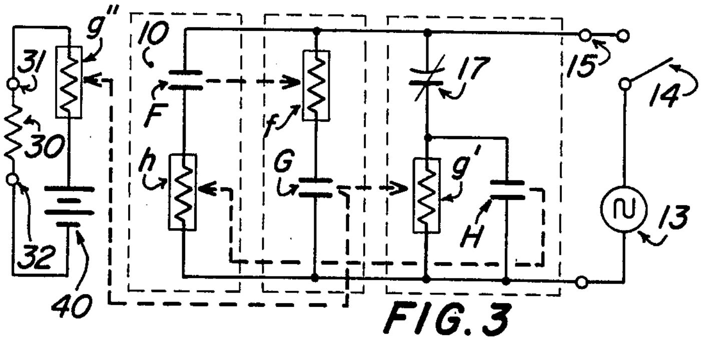
FIG. 3 is another embodiment of my invention.

FIG. 3 depicts an oscillator using a single delay stage consisting of photoconductor $f$ and electroluminescent cell G. The input stage 10 includes an electroluminescent cell F and a photoconductor $h$ and the feedback unit 12 includes a photoconductor $g'$ and an electroluminescent cell H. The load resistor 30 is connected in series with a photoconductor $g''$ and a battery 40. The operation of this circuit is substantially the same as that of the circuit of FIG. 1 and therefore need not be described in detail. However, it shall be noted that the voltage appearing across resistor 30 is a D.C. pulse and has the same waveshape as the envelope of the voltage $V_o$ shown in FIG. 2.

A circuit utilizing the configuration shown in FIG. 3 in which the electroluminescent cells were composed of zinc sulfide, the photoconductor was made of zinc selenide, and capacitor 17 had a value of 100 micromicrofarads oscillated at 5 cycles per second with an input voltage 280 volts at 500 cycles per second.

As many changes could be made in the above construction and many different embodiments could be made without departing from the scope thereof it is intended that all matter contained in the above description or shown in the accompanying drawings shall be interpreted as illustrative and not in a limiting sense.

What is claimed is:

An oscillator comprising (a) a pair of input terminals for coupling to a voltage source, (b) an input unit, said input unit consisting of a photoconductor electrically connected in series with an electroluminescent cell directly across said pair of input terminals, said photoconductor and said electroluminescent cell being optically isolated from each other, (c) a delay unit comprising N delay stages where N is any integer, each of said N delay stages consisting of a photoconductor electrically connected in series with an electroluminescent cell directly across said input terminals, the photoconductor in the first of said N stages being optically coupled to the electroluminescent cell in said input unit and each of the photoconductors in the remainder of said N stages being optically coupled to the electroluminescent cell in the preceding delay stage, the photoconductor in each of said N stages being optically isolated from the electroluminescent cell in the same stage, (d) a feedback unit, said feedback unit including a photoconductor electrically connected in series with a capacitor across said input terminals and optically coupled to the electroluminescent cell in the Nth stage of said delay unit, said feedback unit further including an electroluminescent cell electrically connected in parallel with the photoconductor in said feedback unit and optically coupled to the photoconductor in said input unit, and (e) output means coupled across said input terminals, said output means including a photoconductor and a pair of output terminals, said photoconductor being optically coupled to the electroluminescent cell in said input unit.

References Cited by the Examiner

UNITED STATES PATENTS

| | | | |
|---|---|---|---|
| 2,833,936 | 5/1958 | Ress | 250—213 |
| 2,900,574 | 8/1959 | Kazan | 250—213 |
| 2,907,001 | 9/1959 | Loebner | 250—213 |
| 3,039,005 | 6/1962 | O'Connell et al. | 250—213 |
| 3,146,352 | 8/1964 | Trimble | 250—213 |
| 3,160,756 | 12/1964 | Marko | 250—213 |

OTHER REFERENCES

O'Connell et al.: "EL–PC Neutron Analogue," IBM Technical Disclosure Bulletin, vol. 4, No. 7, Dec. 1961, page 84.

RALPH G. NILSON, *Primary Examiner*.

ARCHIE R. BORCHELT, FREDERICK M. STRADER, *Examiners*.